United States Patent
Sonntag (10) Patent No.: US 8,836,392 B2
(45) Date of Patent: Sep. 16, 2014

(54) DIGITAL LOCKED LOOP FOR PRODUCING A CLOCK HAVING A SELECTED FREQUENCY RATIO RELATIVE TO A CLOCK PRODUCED BY A MEMS-BASED OSCILLATOR

(71) Applicant: Silicon Laboratories Inc., Austin, TX (US)

(72) Inventor: Jeffrey L. Sonntag, Austin, TX (US)

(73) Assignee: Silicon Laboratories Inc., Austin, TX (US)

(*) Notice: Subject to any disclaimer, the term of this patent is extended or adjusted under 35 U.S.C. 154(b) by 0 days.

(21) Appl. No.: 13/691,011

(22) Filed: Nov. 30, 2012

(65) Prior Publication Data

US 2013/0321051 A1 Dec. 5, 2013

Related U.S. Application Data

(60) Provisional application No. 61/655,297, filed on Jun. 4, 2012.

(51) Int. Cl.
*H03L 7/06* (2006.01)

(52) U.S. Cl.
USPC .......................................... 327/158; 327/149

(58) Field of Classification Search
None
See application file for complete search history.

(56) References Cited

U.S. PATENT DOCUMENTS

| | | | |
|---|---|---|---|
| 6,831,525 B1 | 12/2004 | Beaudin et al. | |
| 7,106,143 B2 | 9/2006 | Bloch et al. | |
| 7,211,926 B2 | 5/2007 | Quevy et al. | |
| 7,212,075 B2 | 5/2007 | Young et al. | |
| 7,511,870 B2 | 3/2009 | Ho et al. | |
| 7,755,441 B1 | 7/2010 | Cioffi et al. | |
| 7,760,036 B2 | 7/2010 | Sutardja | |
| 7,876,167 B1 | 1/2011 | McCraith et al. | |
| 7,982,550 B1* | 7/2011 | Quevy et al. | 331/176 |
| 8,384,449 B2* | 2/2013 | Namba et al. | 327/156 |
| 2005/0151592 A1 | 7/2005 | Partridge et al. | |
| 2006/0109059 A1 | 5/2006 | Skerritt | |
| 2007/0176705 A1 | 8/2007 | Sutardja | |
| 2007/0290763 A1 | 12/2007 | Partridge et al. | |
| 2010/0093125 A1 | 4/2010 | Quevy et al. | |
| 2011/0210797 A1* | 9/2011 | Quevy et al. | 331/48 |
| 2012/0043999 A1* | 2/2012 | Quevy et al. | 327/147 |

OTHER PUBLICATIONS

Staszewski, Robert Bogdan, "State-of-the-Art and Future Directions of High-Performance All-Digital Frequency Synthesis in Nanometer CMOS," Circuits and Systems (ISCAS), Proceedings of 2010 IEEE International Symposium, May 30, 2010-Jun. 2, 2010, pp. 229-232.

Perrott, Michael H. et al., "A Low-Area Switched-Resistor Loop-Filter Technique for Fractional-N Synthesizers Applied to a MEMS-Based Programmable Oscillator," ISSCC 2010, Session 13, Frequency & Clock Synthesis, 13.1, pp. 244-246.

(Continued)

*Primary Examiner* — Cassandra Cox (74) *Attorney, Agent, or Firm* — Abel Law Group, LLP (57) ABSTRACT

A Micro Electrical Mechanical System (MEMS) oscillator supplies a MEMS clock signal to a digital locked loop that generates an output clock signal having a frequency that corresponds to a desired frequency ratio between the MEMS oscillator output signal and the digital locked loop output signal. The frequency ratio may be determined, at least in part, as a function of temperature.

20 Claims, 5 Drawing Sheets

(56) References Cited

OTHER PUBLICATIONS

Quevy et al., "Highly Accurate Temperature Stable Clock Based on Differential Frequency Discrimination of Oscillators," Non-final Office action dated Aug. 9, 2012 for U.S. Appl. No. 13/285,608, 13 pages.

Quevy et al., "Highly Accurate Temperature Stable Clock Based on Differential Freuqency Discrimination of Oscillators," SILA:424, Amendment and Response to Final Office action filed Apr. 11, 2011, U.S. Appl. No. 12/217,190, 14 pages.

Quevy et al., "Highly Accurate Temperature Stable Clock Based on Differential Frequency Discrimination of Oscillators," SILA:424, Final Office action mailed Feb. 9, 2011, U.S. Appl. No. 12/217,190, 5 pages.

Quevy et al., "Highly Accurate Temperature Stable Clock Based on Differential Frequency Discrimination of Oscillators," SILA:424, Notice of Allowance mailed Apr. 22, 2011, U.S. Appl. No. 12/217,190, 5 pages.

Quevy et al., "Highly Accurate Temperature Stable Clock Based on Differential Frequency Discrimination of Oscillators", SILA:424, Amendment and Response to Office action filed Jan. 4, 2011, U.S. Appl. No. 12/217,190, 17 pages.

Quevy et al., "Highly Accurate Temperature Stable Clock Based on Differential Frequency Discrimination of Oscillators," SILA:424, U.S. Appl. No. 12/217,190, filed Jul. 1, 2008, 37 pages.

Quevy et al., "Highly Accurate Temperature Stable Clock Based on Differential Frequency Discrimination of Oscillators," SILA:424, Office action mailed Sep. 8, 2010, U.S. Appl. No. 12/217,190, 9 pages.

Zamora et al., "A 1.5mW, 200MHz CMOS VCO for wireless Biotelemetry," Stanford University, 1997 14 pages.

\* cited by examiner

DIGITAL LOCKED LOOP FOR PRODUCING A CLOCK HAVING A SELECTED FREQUENCY RATIO RELATIVE TO A CLOCK PRODUCED BY A MEMS-BASED OSCILLATOR

CROSS-REFERENCE TO RELATED APPLICATION(S)

This application claims benefit under 35 U.S.C. §119(e) of U.S. Provisional Application No. 61/655,297, filed Jun. 4, 2012, entitled "DIGITAL LOCKED LOOP FOR PRODUCING A CLOCK HAVING A SELECTED FREQUENCY RATIO RELATIVE TO A CLOCK PRODUCED BY A MEMS-BASED OSCILLATOR," naming Jeffrey L. Sonntag as inventor, which application is incorporated by reference herein in its entirety.

BACKGROUND

1. Field of the Invention

This invention relates to generating a clock signal and more particularly using a MEMS oscillator and digital locked loop to generate the clock signal.

2. Description of the Related Art

Figure 1:
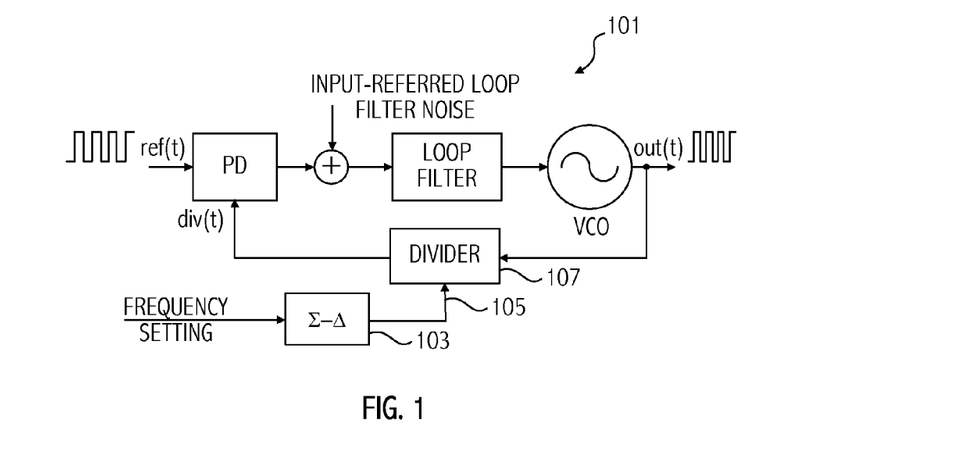
FIG. 1 illustrates a prior art fractional-N synthesizer.

FIG. 1 illustrates one approach for generating a clock signal having a desired frequency using a fractional-N synthesizer 101 to generate to the desired frequency. A frequency setting is supplied to the sigma delta modulator 103 that generates a divide signal 105 for the divider 107. The use of the fractional-N synthesizer allows the generated frequency (out(t)) to have a non-integer relationship with the reference frequency (ref(t)).

SUMMARY OF EMBODIMENTS OF THE INVENTION

In an embodiment an apparatus includes a Micro Electrical Mechanical System (MEMS) oscillator to supply a MEMS oscillator output signal; and a digital locked loop coupled to receive the MEMS oscillator output signal and to receive a desired frequency ratio and to supply a digital locked loop output signal having a frequency that corresponds to the desired frequency ratio between the MEMS oscillator output signal and the digital locked loop output signal. The digital locked loop may be an all digital phase-locked loop or an all digital frequency locked loop. The frequency ratio may be determined, at least in part, as a function of temperature.

In another embodiment, a method includes receiving a MEMS oscillator output signal at a digital locked loop; receiving a desired frequency ratio at the digital locked loop; and maintaining the desired frequency ratio between an output signal of the digital locked loop and the MEMS oscillator output signal. The method may further include adjusting the frequency ratio according to a sensed temperature.

BRIEF DESCRIPTION OF THE DRAWINGS

The present invention may be better understood, and its numerous objects, features, and advantages made apparent to those skilled in the art by referencing the accompanying drawings.

The use of the same reference symbols in different drawings indicates similar or identical items.

DETAILED DESCRIPTION

Figure 2:
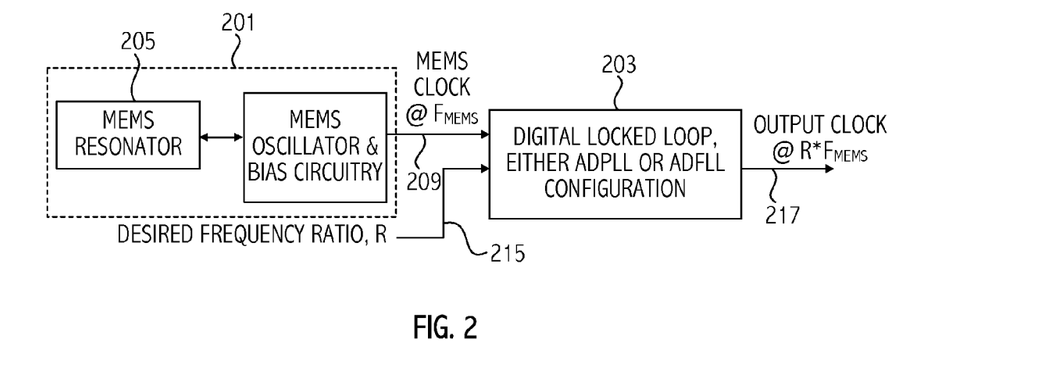
FIG. 2 illustrates an embodiment using a Micro Electrical Mechanical System (MEMS) oscillator and a digital locked loop.

Referring to FIG. 2, an embodiment utilizes a Micro Electrical Mechanical System (MEMS) oscillator 201 and a digital locked loop 203. MEMS generally refers to an apparatus incorporating a mechanical structure capable of movement. MEMS are commonly used as resonators in timing applications. The MEMS oscillator 201 combines the MEMS resonator 205 and oscillator circuit and bias circuit 207 to sustain oscillation of the MEMS resonator and generate a MEMS clock signal at node 209. The MEMS oscillator 201 and digital locked loop 203 may be disposed on a single integrated circuit.

Use of a MEMS-based oscillator allows features of MEMS oscillators to be exploited in certain embodiments. First, fabrication of MEMS oscillators is compatible with CMOS manufacturing processes and can be integrated on the same substrate with other circuits, thus providing a low cost of manufacturing and a small footprint. In addition, MEMS oscillators have good long-term stability. One shortcoming of MEMS oscillators is that they tend to have short-term stability issues that are reflected in phase noise or jitter. In addition, certain MEMS oscillators can be affected by variations in temperature.

The digital locked loop 203, may be, e.g., an all digital phase-locked loop (ADPLL) or an all digital frequency-locked loop (ADFLL). The digital locked loop receives a desired frequency ratio on node 215. The desired frequency ratio indicates the desired ratio between the output clock of the digital locked loop on node 217 and the MEMS oscillator output clock on node 209. The digital locked loop provides an output clock that has a frequency of $R \times F_{MEMS}$, where R is the desired ratio and $F_{MEMS}$ is the frequency of the MEMS oscillator clock signal. Many applications require a large number of bits for R for sufficient resolution e.g., greater than or equal to 28.

Figure 3:
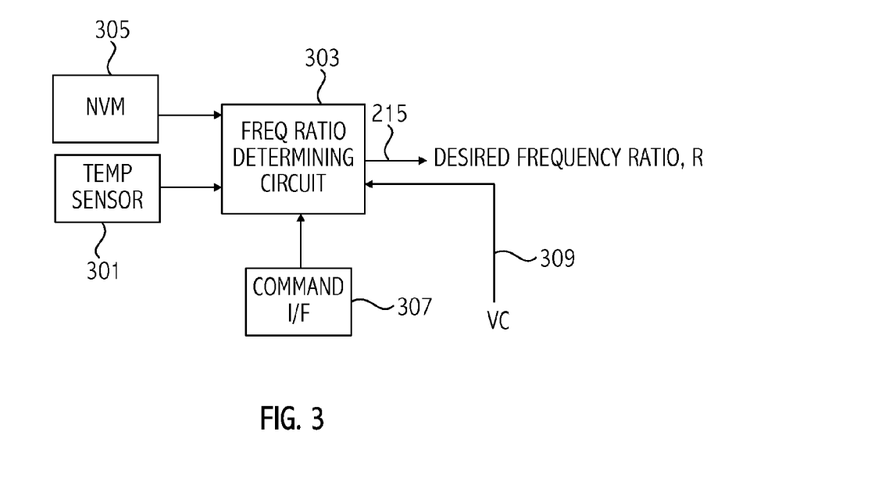
FIG. 3 illustrates an embodiment in which the frequency ratio determining circuit has various inputs that may be used to determine the desired frequency ratio.

The ratio may be adjusted as a function of temperature. Thus, as shown in FIG. 3, a temperature sensor 301 may provide a sensed temperature that is used to adjust the frequency ratio in frequency ratio determining circuit 303. The determining circuit 303 may provide, e.g., a look-up table function to adjust the ratio. Thus, temperature may be used as an index to a look-up table to determine the correct temperature adjustment to the existing frequency ratio. The temperature compensation may be implemented as an equation representing a temperature curve, and one or more variables associated with a particular temperature may be stored in the memory and applied to compensate for temperature. Thus, an equation may be utilized, e.g., a fifth order compensation curve, for frequency compensation versus temperature to adjust the frequency ratio based on the temperature. Alternatively, another temperature compensation technique may be utilized. The calculation or lookup logic can determine the appropriate scale factor by accessing a memory (not shown). The desired frequency ratio determining circuit 303 may be implemented, e.g., in a programmed microcontroller, in hardware or in combination.

The initial desired frequency ratio may be supplied, e.g., from non-volatile memory 305 or a command interface 307. The command interface may be a serial interface that is used to supply the ratio and write the ratio to a register (not shown) or to NVM 305. In some embodiments, the ratio may be further adjusted using an external control signal. For example, in an embodiment, a voltage control signal VC 309 is supplied on an external pin of the integrated circuit. That voltage may be converted to a digital signal that causes the frequency ratio to be adjusted by the frequency ratio determining circuit 303 with an appropriate gain factor corresponding to the voltage applied. Alternatively, the voltage control signal VC 309 may be used to both set and adjust the frequency ratio based on the voltage value of the VC signal. The use of temperature compensation allows the temperature coefficient of the digital locked loop output signal to be lower than the temperature coefficient of the MEMS oscillator output signal. Thus, the output signal of the digital locked loop is less susceptible to temperature changes.

Figure 4:
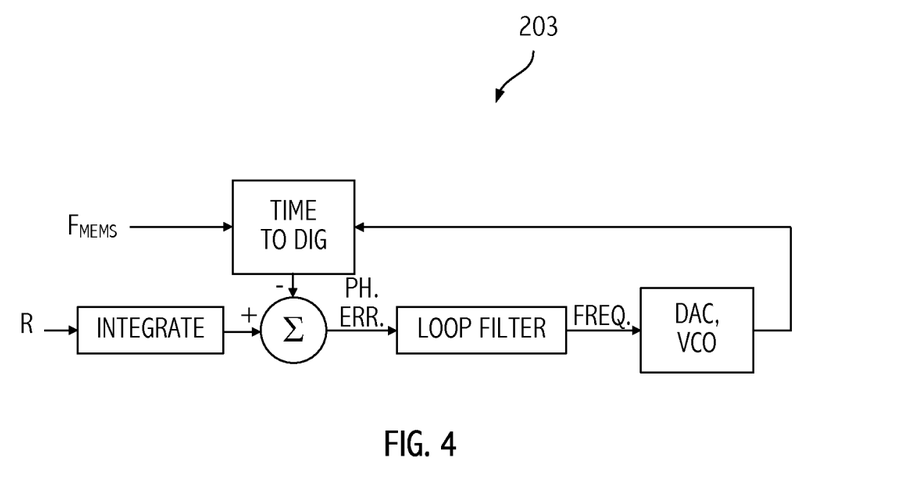
FIG. 4 illustrates an embodiment in which the digital locked loop is implemented in an all digital phase-locked loop (ADPLL) configuration.
Figure 5:
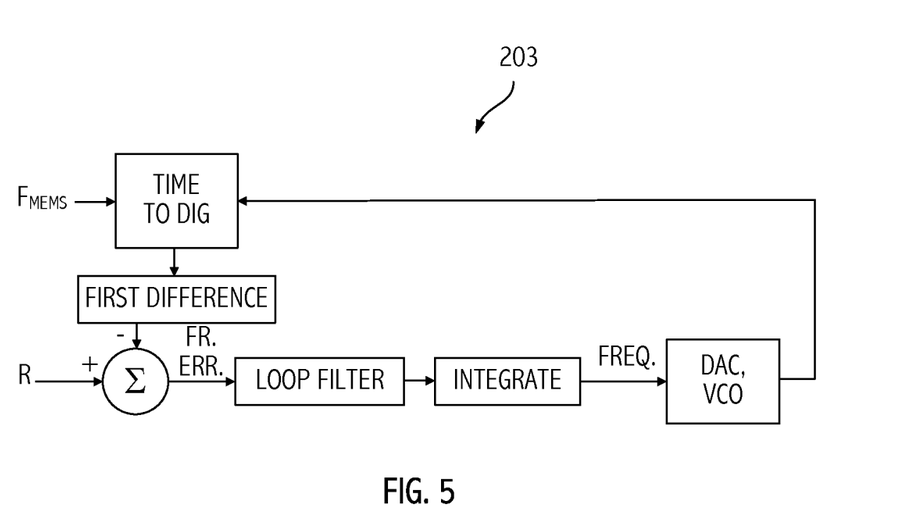
FIG. 5 illustrates an embodiment in which the digital locked loop is implemented in an all digital frequency-locked loop (ADFLL) configuration.
Figure 6:
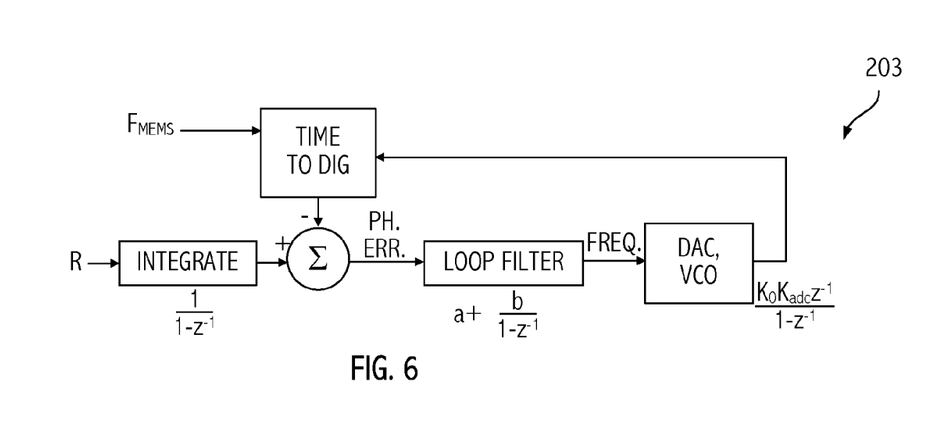
FIG. 6 show some additional details of an embodiment of an ADPLL configuration.
Figure 7:
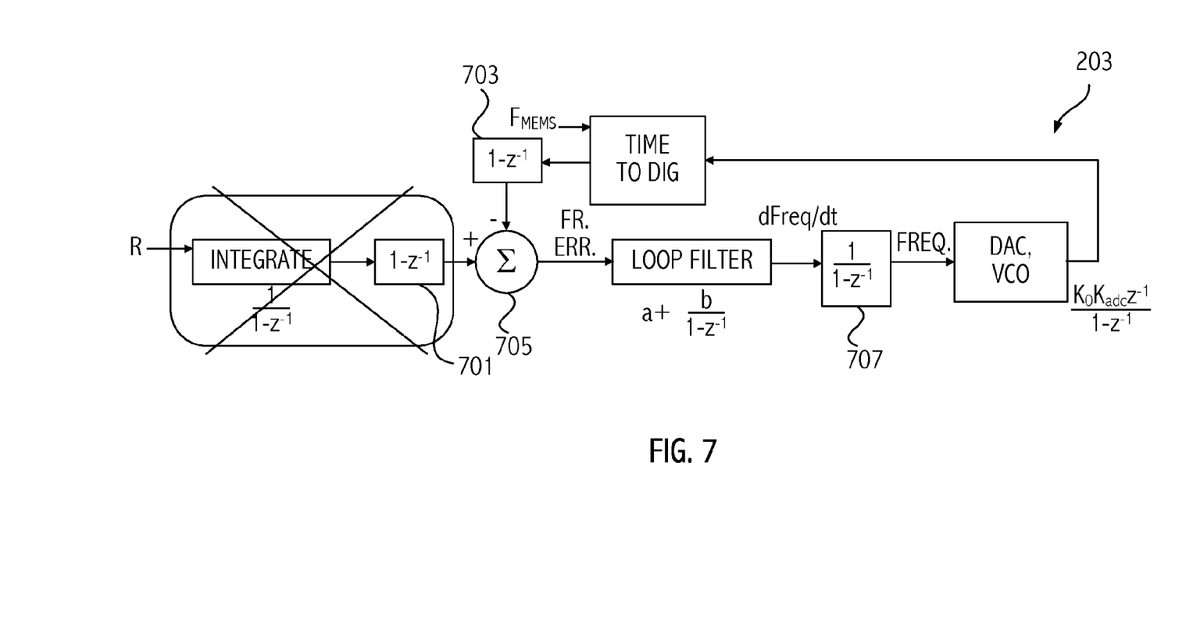
FIG. 7 shows some additional details of an embodiment of an ADFLL configuration.

Referring to FIG. 4 the digital locked loop 203 is shown in an all-digital PLL configuration. Referring to FIG. 5 the digital locked loop 203 is shown in an all-digital FLL configuration. FIGS. 6 and 7 show some additional details of the ADPLL and ADFLL configurations and the differences between them. The loop gain may be the same for both the ADPLL and ADFLL. In an embodiment, the ADFLL has an extra differencing circuit. In either configuration, loop filter gains (a, b) can be changed dynamically to speed startup. Transients caused by changes are smaller in the ADFLL. In an embodiment, to transform the ADPLL to an ADFLL, difference elements 701 and 703 are inserted in both paths before the summer 705 and an integrator 707 is inserted after the summer.

After initial settling, the ADPLL produces the correct frequency as the sum of a contribution through gain "a" times the current phase error and value in the integrator. Eventually, the integrator fills with the correct final value and there is no need for a phase error to support the correct output frequency. But in a very stable system, that takes awhile, so if the goal is to settle as quickly as possible, and "a" was initially high, and it is reduced after initial settling, it takes a different phase error to produce the correct output frequency. Switching "a" causes a phase transient which induces a frequency transient and takes time to settle out.

For the ADFLL, the output frequency depends on contents of the final integrator. The value of "b" controls the gain into the first integrator, which holds a value representing the required dFreq/dt, plus noise. For fast startup, "b" can be initially kept to zero with the first integrator zeroed out. So when the correct frequency is first obtained, the output of loop filter is zero, and "a" can be switched freely without causing a transient. Note, either of the two systems (ADFLL or ADPLL) can be used in combination with the MEMS oscillator in various embodiments.

Figure 8:
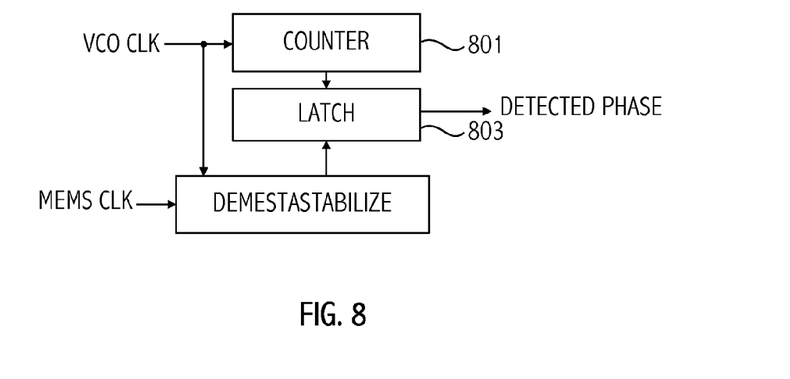
FIG. 8 illustrates an implementation of a time to digital converter circuit.

Each of the digital locked loop embodiments described in FIGS. 4-7 includes a time to digital converter circuit that converts the relationship between the two input clocks to a digital value. FIG. 8 illustrates one implementation of such a circuit that includes a counter 801 operating from the VCO clock (the VCO of the digital locked loop), with reference clock edges (MEMS oscillator clock) used to take a snapshot of the counter contents in latch 803.

Figure 9:
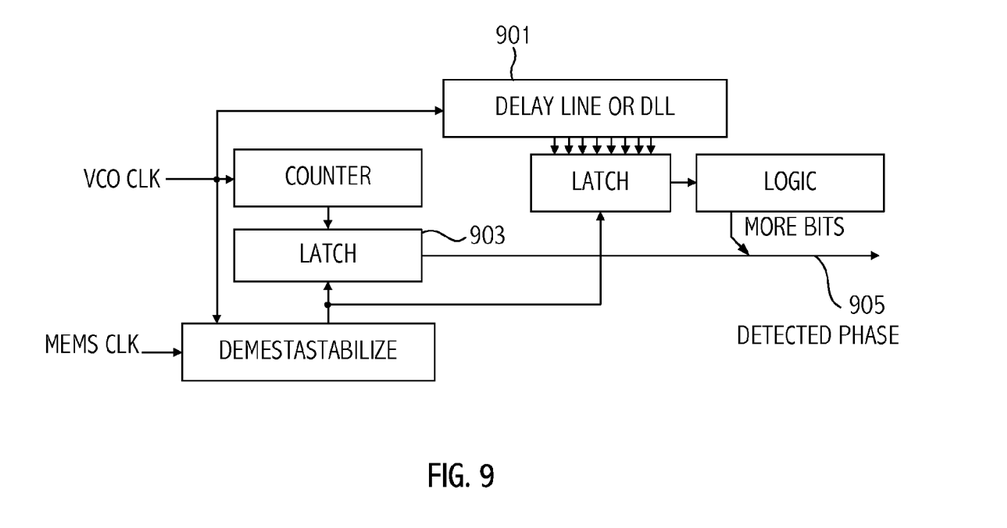
FIG. 9 illustrates another implementation of a time to digital converter circuit.

It may be desirable to have more resolution than available from just the counter embodiment of FIG. 8. FIG. 9 illustrates one approach to provide more resolution than available by taking the snapshot as in FIG. 8. The approach of FIG. 9 uses a delay locked loop (DLL) 901. The DLL 901 effectively creates many equally-spaced phases of the VCO clock (DLL output), which are also sampled. With the DLL producing N equally-spaced phases, resolution is effectively improved by a factor of N, reducing the quantization noise produced by the time to digital conversion process. That additional resolution is combined with the counter value latched into latch 903 to provide a digital representation 905 of the phase relationship between the output of the MEMS oscillator (MEMS clock) and the output of the digital locked loop (the VCO clock). Taking the first difference of a sequence of values 905 provides the frequency ratio between the MEMS clock and the VCO clock. However, the approach of FIG. 9 provides limited additional resolution as minimum delays may not be sufficiently small. Disadvantages of the approach of FIG. 9 also include the power required to run the high speed VCO clock through the DLL and errors caused by Monte Carlo mismatch of small devices in the DLL.

Figure 10:
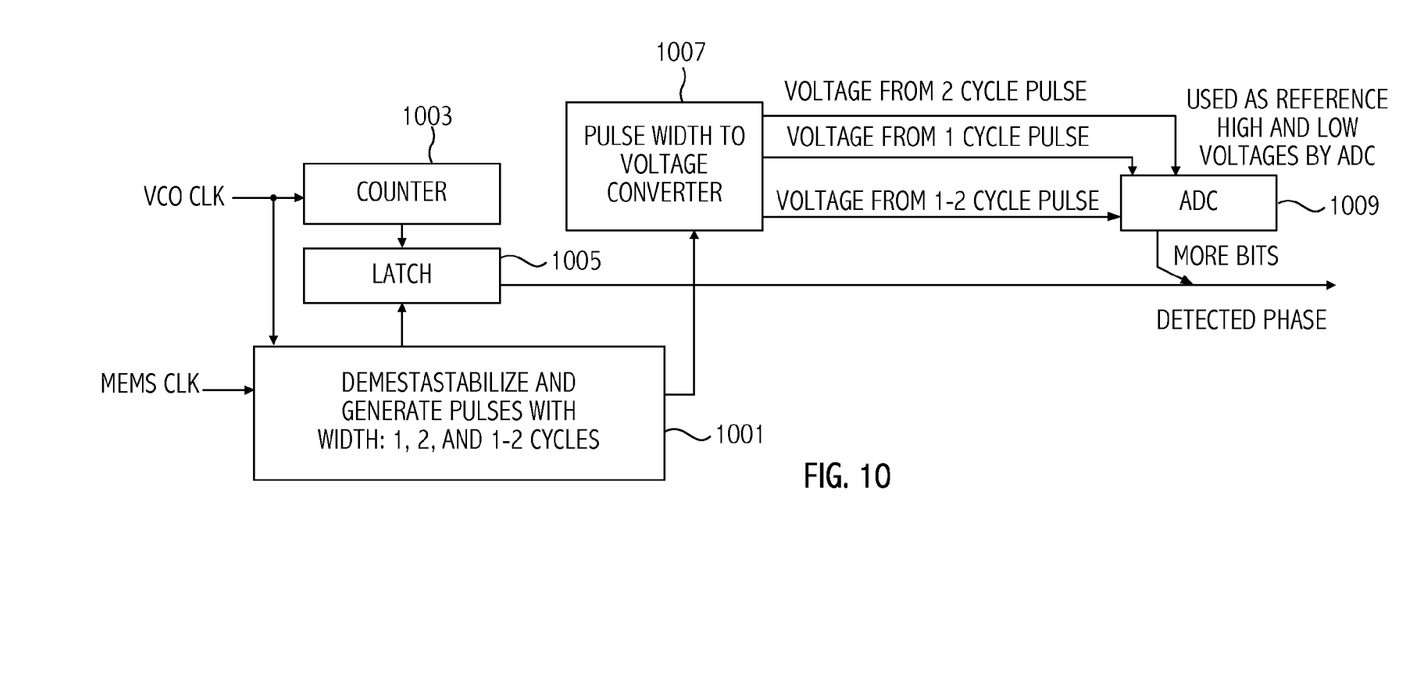
FIG. 10 illustrates another embodiment of a time to digital converter circuit.

An alternative implementation illustrated in FIG. 10 addresses the problems related to power, mismatch, and limited additional resolution. A digital circuit 1001 demetastabilizes the MEMS clock into the VCO clock domain, which is used to latch the counter value from counter 1003 into latch 1005. The digital circuit 1001 also generates three different pulses. The first two pulses are one-cycle and two-cycle wide pulses of the VCO clock. In addition, the digital circuit 1001 generates a third pulse having a width between one and two cycles of the VCO clock, whose width depends on the phase of VCO clock versus the MEMS clock. The pulses are supplied to a pulse width to voltage converter circuit 1007, which converts the three pulses to three corresponding voltage values. An analog to digital converter (ADC) 1009 utilizes the integration of the one-cycle and two-cycle pulses as low/high references and converts the pulse that varies between one and two cycles based on the phase relationship between the VCO and MEMS clock, to a digital value corresponding to extra resolution. In a minimal power implementation, the analog pulse width to voltage converter (an integrator) 1007 and ADC 1009 can be powered up only just in time for each measurement and otherwise powered down.

Thus, various approaches have been described that exploit combination of a MEMS oscillator with digital locked loop. The description of the invention set forth herein is illustrative, and is not intended to limit the scope of the invention as set forth in the following claims. Other variations and modifications of the embodiments disclosed herein, may be made based on the description set forth herein, without departing from the scope of the invention as set forth in the following claims.

What is claimed is:

1. An apparatus comprising:
   a Micro Electrical Mechanical System (MEMS) oscillator to supply a MEMS oscillator output signal; and
   a digital locked loop coupled to receive the MEMS oscillator output signal and to receive a desired frequency ratio and to supply a digital locked loop output signal having a frequency that corresponds to the desired frequency ratio between the MEMS oscillator output signal and the digital locked loop output signal, wherein a first temperature coefficient of the digital locked loop output signal is lower than a second temperature coefficient of the MEMS oscillator output signal.

2. The apparatus as recited in claim 1 wherein the digital locked loop is an all digital phase-locked loop.

3. The apparatus as recited in claim 1 wherein the frequency ratio is based at least in part on input provided through a communications interface.

4. The apparatus as recited in claim 1 wherein the frequency ratio is generated at least in part as a function of temperature.

5. The apparatus as recited in claim 4 further comprising:
a temperature sensor to provide a temperature indication; and
a temperature compensation circuit responsive to adjust the frequency ratio based on the temperature indication.

6. The apparatus as recited in claim 1 wherein the MEMS oscillator includes a MEMS resonator and a MEMS oscillator sustaining circuit.

7. The apparatus as recited in claim 1 wherein the MEMS oscillator and the digital locked loop are disposed on an integrated circuit die.

8. An apparatus comprising:
a Micro Electrical Mechanical System (MEMS) oscillator to supply a MEMS oscillator output signal; and
a digital locked loop coupled to receive the MEMS oscillator output signal and to receive a desired frequency ratio and to supply a digital locked loop output signal having a frequency that corresponds to the desired frequency ratio between the MEMS oscillator output signal and the digital locked loop output signal,
wherein the digital locked loop further comprises a time to digital circuit to provide a digital representation corresponding to a phase difference between the MEMS oscillator output signal and the digital locked loop output signal.

9. The apparatus as recited in claim 8 wherein the digital locked loop further comprises a loop filter and loop filter gain is adjusted dynamically to speed startup.

10. The integrated circuit as recited in claim 8 wherein the time to digital circuit comprises:
a counter coupled to count according to the digital locked loop output signal from an oscillator circuit of the digital locked loop; and
a latch circuit coupled to latch a count value of the counter based on the MEMS oscillator output signal, the count value corresponding to the phase difference.

11. The integrated circuit as recited in claim 10 wherein the time to digital circuit further comprises:
a delay line to provide multiple phases of the digital locked loop output signal; and
a second latch circuit coupled to the delay line circuit;
wherein the second latch circuit and the delay line are used to provide additional resolution to the count value.

12. The apparatus as recited in claim 8 wherein the time to digital circuit comprises:
a counter coupled to count according to the digital locked loop output signal from an oscillator circuit of the digital locked loop;
a latch circuit coupled to latch a count value of the counter based on the MEMS oscillator output signal;
a pulse generating circuit to generate first and second pulses corresponding respectively to one and two cycles of the digital locked loop output signal and to generate a third pulse having a pulse width of between one and two cycles of the digital locked loop output signal that depends on the phase difference between the digital locked loop output signal and the MEMS oscillator output signal;
a pulse width to voltage converter circuit to convert the third pulse to a voltage value;
an analog to digital converter to convert the voltage value to a digital value that is combined with the count value to provide a value corresponding to the phase difference between the MEMS oscillator output signal and the digital-locked loop output signal.

13. A method comprising:
receiving a MEMS oscillator output signal at a digital locked loop;
receiving a desired frequency ratio at the digital locked loop;
maintaining the desired frequency ratio between an output signal of the digital locked loop and the MEMS oscillator output signal: and
generating a digital representation corresponding to a phase difference between the output signal of the digital locked loop and the MEMS oscillator output signal.

14. The method as recited in claim 13 further comprising:
adjusting the frequency ratio according to a sensed temperature.

15. The method as recited in claim 13 wherein generating the digital representation comprises:
counting in a counter according to the digital locked loop output signal;
storing a count value of the counter based on the MEMS oscillator output signal;
generating a first pulse having a width of between one and two cycles of the digital locked loop output signal that depends on the phase difference between the digital locked loop output signal and the MEMS oscillator output signal;
converting the first pulse to a first voltage value in a pulse width to voltage converter;
converting the first voltage value to a digital value in an analog to digital converter; and
combining the digital value with the count value as the digital representation corresponding to the phase difference.

16. The method as recited in claim 15 further comprising:
generating second and third pulses corresponding respectively to one and two cycles of the digital locked loop output signal;
supplying the second and third pulses to the pulse width to voltage converter and generating second and third voltage values corresponding to the second and third pulses; and
supplying the second and third voltage values to the analog to digital converter for use in generating the digital value.

17. The method as recited in claim as recited in claim 16 further comprising powering up the pulse width to voltage converter for each measurement and otherwise maintaining the pulse width to voltage converter powered down.

18. The method as recited in claim 13 further comprising adjusting a loop filter gain of the digital locked loop to speed startup.

19. The method as recited in claim 13 wherein a first temperature coefficient of the output signal of the digital locked loop is lower than a second temperature coefficient of the MEMS oscillator output signal.

20. A method comprising:
receiving a MEMS oscillator output signal at a digital locked loop;
receiving a desired frequency ratio at the digital locked loop;
maintaining the desired frequency ratio between an output signal of the digital locked loop and the MEMS oscillator output signal; and
adjusting a loop filter gain of the digital locked loop to speed startup.

* * * * *